United States Patent
Hill et al.

(10) Patent No.: US 6,914,277 B1
(45) Date of Patent: Jul. 5, 2005

(54) MERGED FINFET P-CHANNEL/N-CHANNEL PAIR

(75) Inventors: Wiley Eugene Hill, Moss Beach, CA (US); Shibly S. Ahmed, San Jose, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 96 days.

(21) Appl. No.: 10/674,400

(22) Filed: Oct. 1, 2003

(51) Int. Cl.$^7$ ................................................ H01L 29/76
(52) U.S. Cl. ...................... 257/213; 257/302; 257/315; 257/316; 257/347; 257/350; 257/351
(58) Field of Search ................................ 257/315, 316, 257/302, 347, 350, 351

(56) References Cited

U.S. PATENT DOCUMENTS 6,657,252 B2 * 12/2003 Fried et al. .................. 257/316

OTHER PUBLICATIONS

Digh Hisamoto et al., "FinFET–A Self–Aligned Double--Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

U.S. Appl. No. 10/728,844; filed Dec. 8, 2003; entitled: "Merged FinFET Inverter/Logic Gate"; 51 pages.

* cited by examiner

*Primary Examiner*—David Nelms
*Assistant Examiner*—Mai-Huong Tran
(74) *Attorney, Agent, or Firm*—Harrity & Snyder LLP

(57) ABSTRACT

A semiconductor device includes an N-channel device and a P-channel device. The N-channel device includes a first source region, a first drain region, a first fin structure, and a gate. The P-channel device includes a second source region, a second drain region, a second fin structure, and the gate. The second source region, the second drain region, and the second fin structure are separated from the first source region, the first drain region, and the first fin structure by an insulating layer.

20 Claims, 21 Drawing Sheets

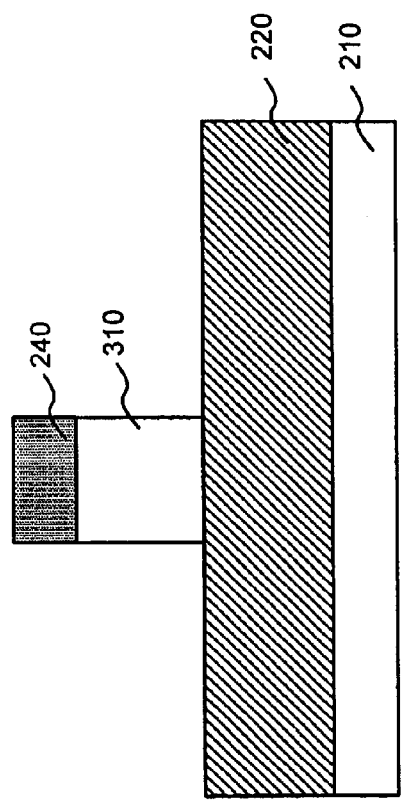
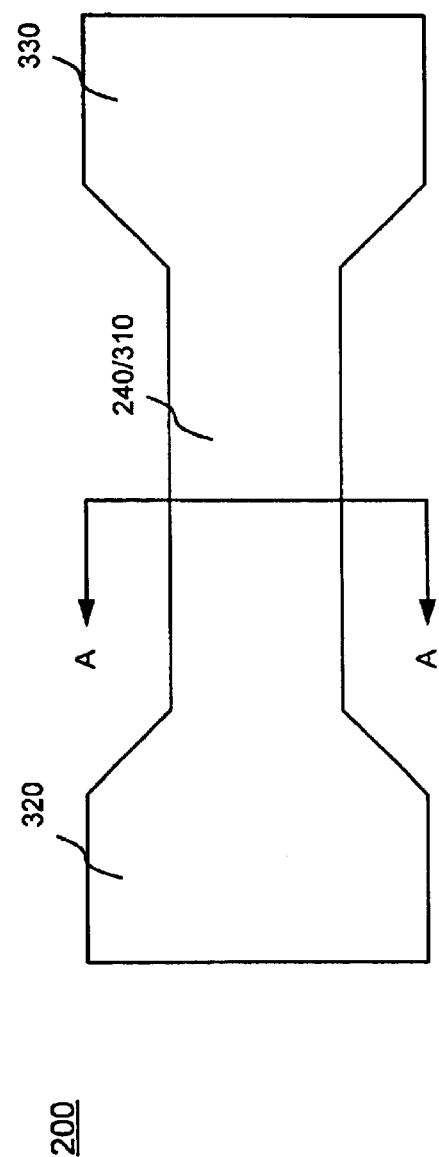

MERGED FINFET P-CHANNEL/N-CHANNEL PAIR

FIELD OF THE INVENTION

The present invention relates generally to semiconductor manufacturing and, more particularly, to forming FinFET devices.

BACKGROUND OF THE INVENTION

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are therefore being explored to improve FET performance and allow further device scaling.

Double-gate MOSFETs represent new structures that have been considered as candidates for succeeding existing planar MOSFETs. In double-gate MOSFETs, two gates may be used to control short channel effects. A FinFET is a double-gate structure that exhibits good short channel behavior. A FinFET includes a channel formed in a vertical fin. The FinFET structure may also be fabricated using layout and process techniques similar to those used for conventional planar MOSFETs.

SUMMARY OF THE INVENTION

Implementations consistent with the principles of the invention merge N-channel and P-channel FinFET devices on a single fin structure. As a result, a maximum density for complimentary FinFET structures can be achieved.

In accordance with the purpose of this invention as embodied and broadly described herein, a semiconductor device includes a fin structure, a source region, a drain region, and at least one gate. The fin structure comprises a semiconducting material and includes an insulating layer. The source region is formed at one end of the fin structure and includes the insulating layer. The insulating layer separates the source region into a first source region and second source region. The drain region is formed at an opposite end of the fin structure and includes the insulating layer. The insulating layer separates the drain region into a first drain region and second drain region.

In another implementation consistent with the present invention, a semiconductor device includes a fin structure, a source region, and a drain region. The fin structure includes an insulating layer that extends an entire length of the fin structure and is positioned approximately in a center of the fin structure. The source region is formed at one end of the fin structure and includes the insulating layer. The insulating layer separates the source region into a first source region and second source region. The drain region is formed at an opposite end of the fin structure and includes the insulating layer. The insulating layer separates the drain region into a first drain region and second drain region.

In yet another implementation consistent with the principles of the invention, a semiconductor device includes an N-channel device and a P-channel device. The N-channel device includes a first source region, a first drain region, a first fin structure, and a gate. The P-channel device includes a second source region, a second drain region, a second fin structure, and the gate. The second source region, the second drain region, and the second fin structure are separated from the first source region, the first drain region, and the first fin structure by an insulating layer.

BRIEF DESCRIPTION OF THE DRAWINGS

The accompanying drawings, which are incorporated in and constitute a part of this specification, illustrate an embodiment of the invention and, together with the description, explain the invention. In the drawings.

FIGS. 2–10 illustrate exemplary views of a merged N-channel/P-channel FinFET device fabricated according to the processing described in FIG. 1;

DETAILED DESCRIPTION

The following detailed description of implementations consistent with the present invention refers to the accompanying drawings. The same reference numbers in different drawings may identify the same or similar elements. Also, the following detailed description does not limit the invention. Instead, the scope of the invention is defined by the appended claims and their equivalents.

Implementations consistent with the principles of the invention form multiple transistors in small amounts of space to achieve increased transistor density.

Exemplary Processing

Figure 1:
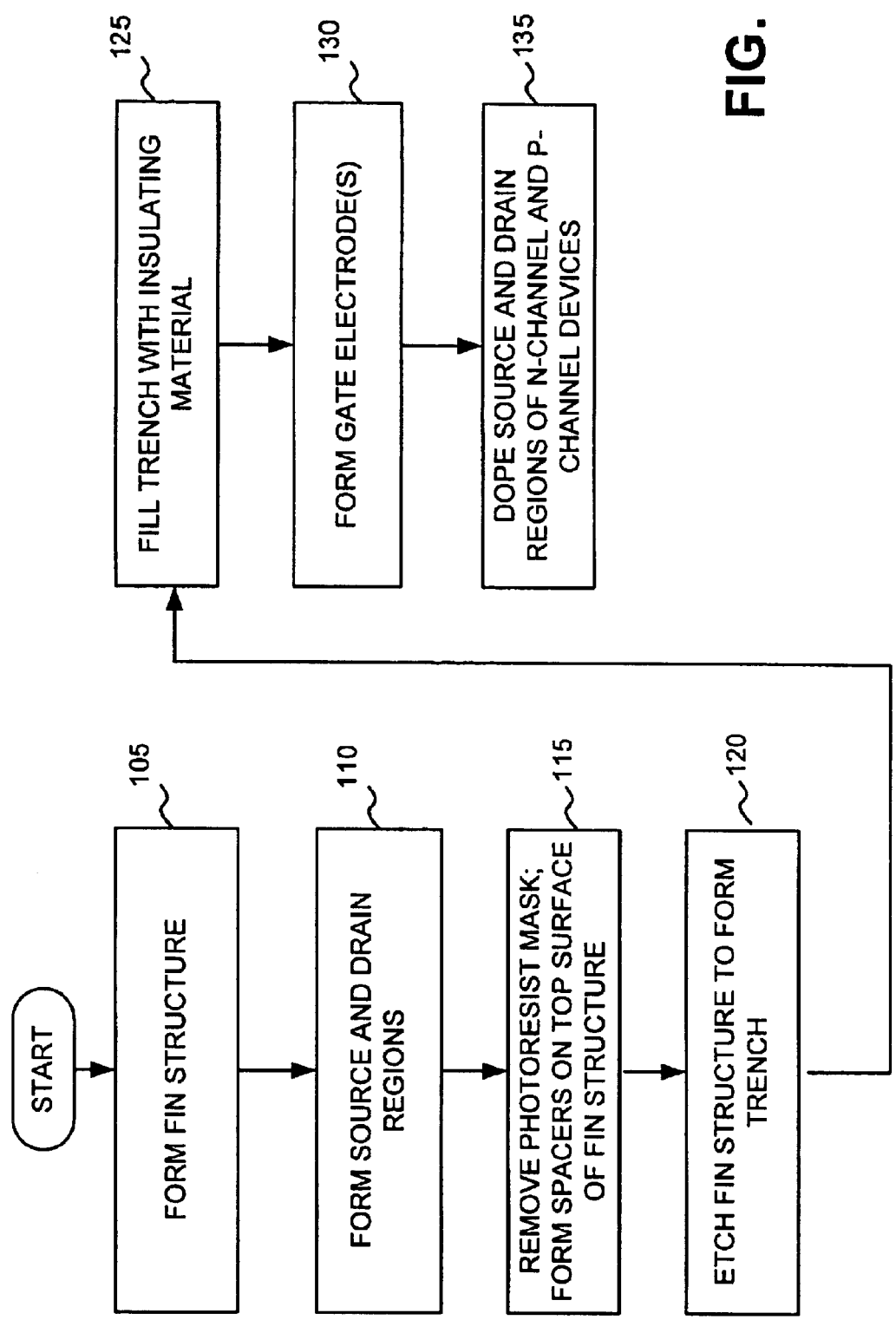
FIG. 1 illustrates an exemplary process for forming a merged N-channel/P-channel FinFET device in an implementation consistent with the principles of the invention.

FIG. 1 illustrates an exemplary process for forming a merged N-channel/P-channel FinFET device in an implementation consistent with the principles of the invention. FIGS. 2–10 illustrate exemplary views of a merged N-channel/P-channel FinFET device fabricated according to the processing described in FIG. 1. The fabrication of one merged N-channel/P-channel FinFET device will be described hereinafter. It will be appreciated, however, that the techniques described herein are equally applicable to forming more than one merged N-channel/P-channel FinFET device.

Figure 2:
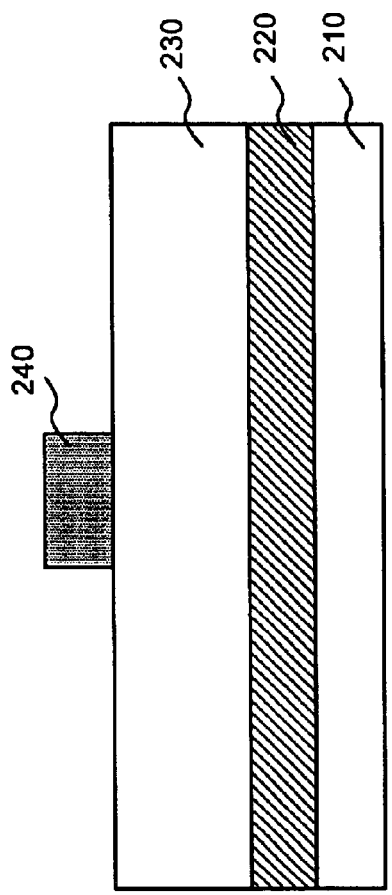

With reference to FIGS. 1 and 2, processing may begin with a semiconductor device 200 that includes a silicon-on-insulator (SOI) structure having a silicon substrate 210, a buried oxide layer 220, and a silicon layer 230 on buried oxide layer 220. Buried oxide layer 220 and silicon layer 230 may be formed on substrate 210 in a conventional manner.

In an exemplary implementation, buried oxide layer 220 may include a silicon oxide and may have a thickness ranging from about 1500 Å to about 3000 Å. Silicon layer 230 may include monocrystalline or polycrystalline silicon having a thickness ranging from about 200 Å to about 1000 Å. Silicon layer 230 is used to form a fin structure, as described in more detail below.

In alternative implementations consistent with the present invention, substrate 210 and layer 230 may comprise other semiconducting materials, such as germanium, or combinations of semiconducting materials, such as silicon-germanium. Buried oxide layer 220 may also include other dielectric materials.

A photoresist material may be deposited and patterned to form a photoresist mask 240 for subsequent processing, as illustrated in FIG. 2. The photoresist material may be deposited and patterned in any conventional manner.

Semiconductor device 200 may then be etched to form a fin structure 310, as illustrated in FIG. 3A (act 105). In an exemplary implementation, silicon layer 230 may be etched in a conventional manner, with the etching terminating on buried oxide layer 220. The portion of silicon layer 230 located under photoresist mask 240 has not been etched, thereby forming a fin structure 310 comprising silicon. In exemplary implementations, the width of fin structure 310 ranges from about 70 Å to about 80 Å. In one implementation, the width of fin structure 310 may be approximately 75 Å.

After the formation of fin structure 310, source and drain regions may be formed adjacent the respective ends of fin structure 310 (act 110). For example, in an exemplary implementation, a layer of silicon, germanium or combination of silicon and germanium may be deposited, patterned and etched in a conventional manner to form source and drain regions. Alternatively, silicon layer 230 may be patterned and etched to form source and drain regions. FIG. 3B illustrates an exemplary top view of semiconductor 200 including source region 320 and drain region 330 formed adjacent fin structure 310 on buried oxide layer 220. The buried oxide layer and the photoresist mask are not illustrated in FIG. 3B for simplicity.

Figure 4:
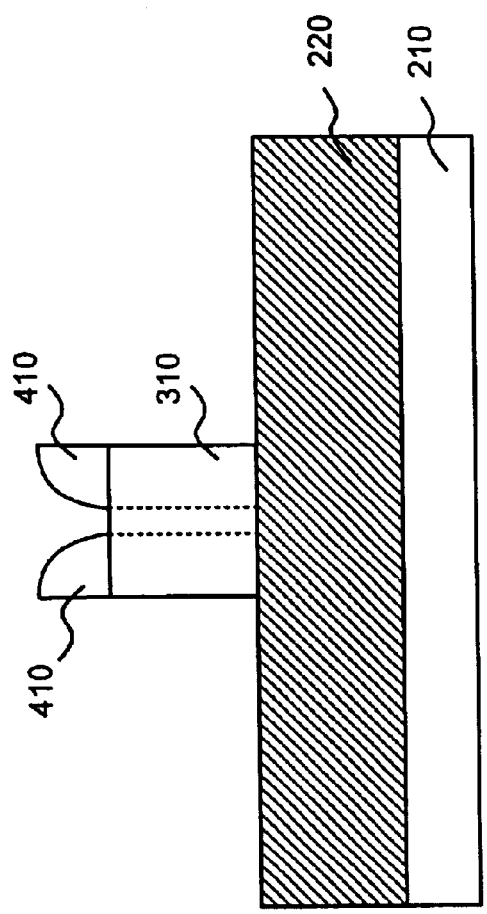

Photoresist mask 240 may then be removed (act 115). Spacer structures 410 may be formed in a conventional manner on a top surface of fin structure 310, as illustrated in FIG. 4 (act 115). The cross-section illustrated in FIG. 4 is taken along line AA in FIG. 3B. In an exemplary implementation, an oxide (or other material) may be deposited over semiconductor device 200 and etched to form spacer structures 410. According to an exemplary implementation consistent with the principles of the invention, spacer structures 410 may be formed to expose a portion of fin structure 310 illustrated by the dotted lines in FIG. 4. The width of the exposed portion of fin structure 310 may range from about 20 Å to about 30 Å. In one implementation, the width of the exposed portion of fin structure 310 may be approximately 25 Å.

Figure 5:
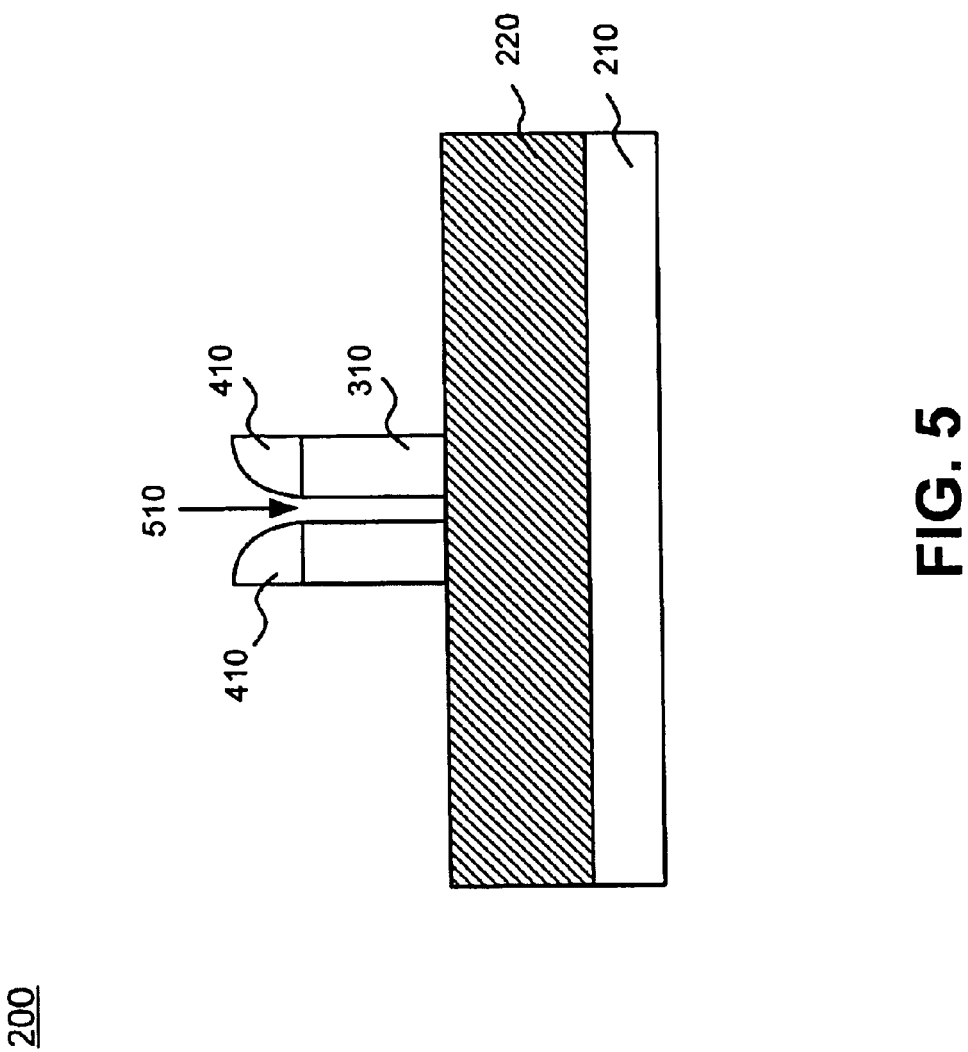

The exposed portion of fin structure 310 may then be etched to form a trench 510, with the etching terminating on buried oxide layer 220, as illustrated in FIG. 5 (act 120). In exemplary implementations, the width of trench 510 may range from about 20 Å to about 30 Å. In one implementation, the width of trench 510 may be approximately 25 Å.

Figure 6:
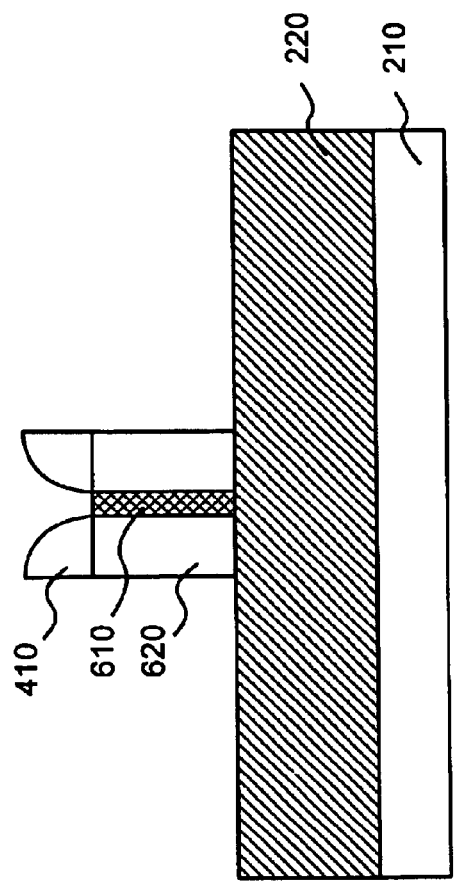

An insulating layer 610 maybe deposited to fill trench 510, as illustrated in FIG. 6 (act 125). Insulating layer 610 may comprise an oxide or a high K dielectric material, such as, for example, $TiO_2$ or $Ta_2O_5$. As will be described in more detail below, insulating layer 610 acts to divide source and drain regions 320 and 330 into two separate source regions and two separate drain regions. Moreover, insulating layer 610 may, in essence, divide fin structure 310 into separate fin structures 620. In exemplary implementations, the width of each fin structure 620 may range from about 20 Å to about 30 Å. In one implementation, the width of the each fin structure 620 may be approximately 25 Å. After insulating layer 610 is deposited, spacer structures 410 may be removed.

A gate dielectric layer (not shown) may optionally be deposited or thermally grown on fin structures 620. The gate dielectric layer may be formed at a thickness ranging from approximately 5 Å to 30 Å. The gate dielectric layer may include conventional dielectric materials, such as an oxide (e.g., silicon dioxide). In other implementations, a nitride material, such as a silicon nitride, may be used as the gate dielectric material.

Figure 7A:
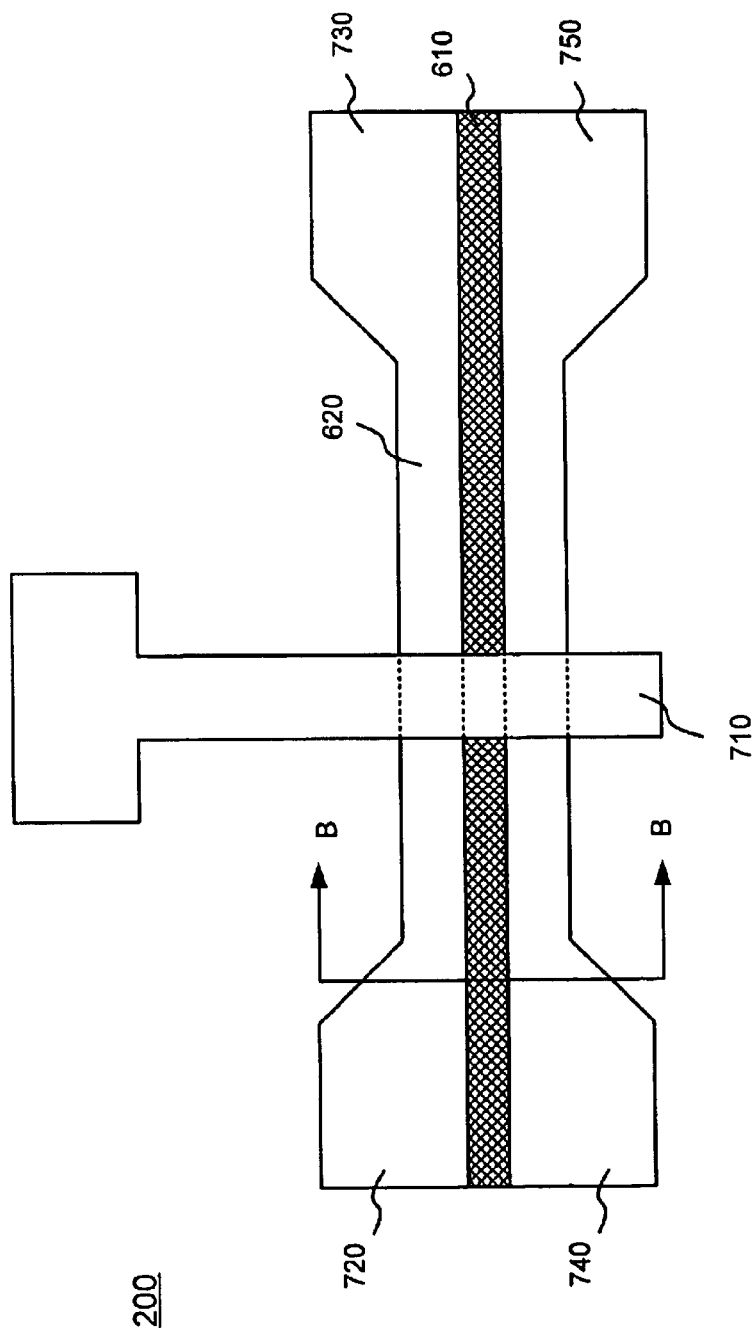

A gate material layer 710 may then be deposited and etched to form one or more gate electrodes, as illustrated in FIG. 7A (act 130). In an exemplary implementation, gate material layer 710 may include polysilicon deposited using conventional chemical vapor deposition (CVD) to a thickness ranging from about 200 Å to about 500 Å. Alternatively, other semiconducting materials, such as germanium or combinations of silicon and germanium, or various metals maybe used as the gate material. In one implementation, gate material layer 710 is patterned and etched to form one or more electrodes that surround top and side surfaces of fin structure 310.

Figure 7B:
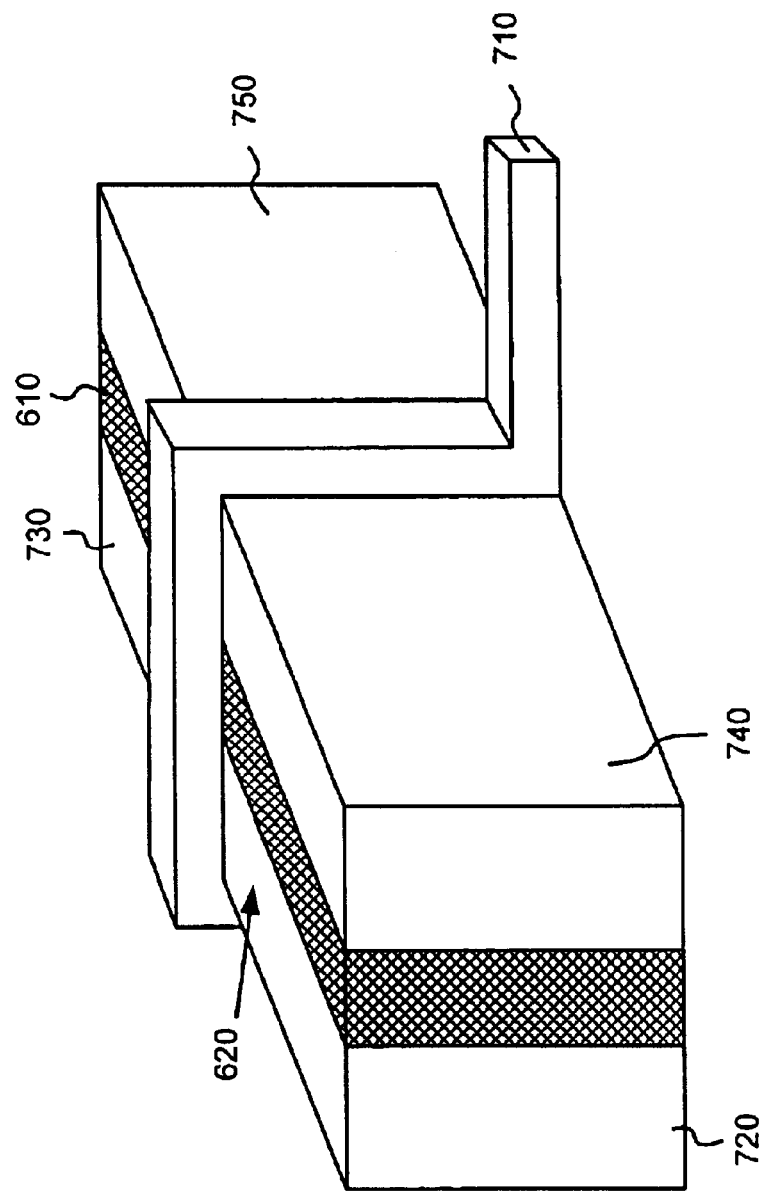

As illustrated in FIG. 7A, insulating layer 610 causes two separate source regions 720 and 740 to be formed, along with two separate drain regions 730 and 750. In this way, an N-channel transistor device can be formed on one side of insulating material 610 (e.g., including source region 740 and drain region 750) and a P-channel transistor device can be formed on the opposite side of insulating material 610 (e.g., including source region 720 and drain region 730). FIG. 7B illustrates an exemplary three-dimensional view of semiconductor device 200 of FIG. 7A. The view illustrated in FIG. 7B is taken along line BB in FIG. 7A.

Source/drain regions 720, 730, 740, and 750 may then be doped with n-type or p-type impurities based on the particular end device requirements (act 135). In exemplary implementations consistent with the principles of the invention, source region 720 and drain region 730 of the P-channel device may be doped with p-type impurities and source region 740 and drain region 750 of the N-channel device may be doped with n-type impurities.

Figure 8:
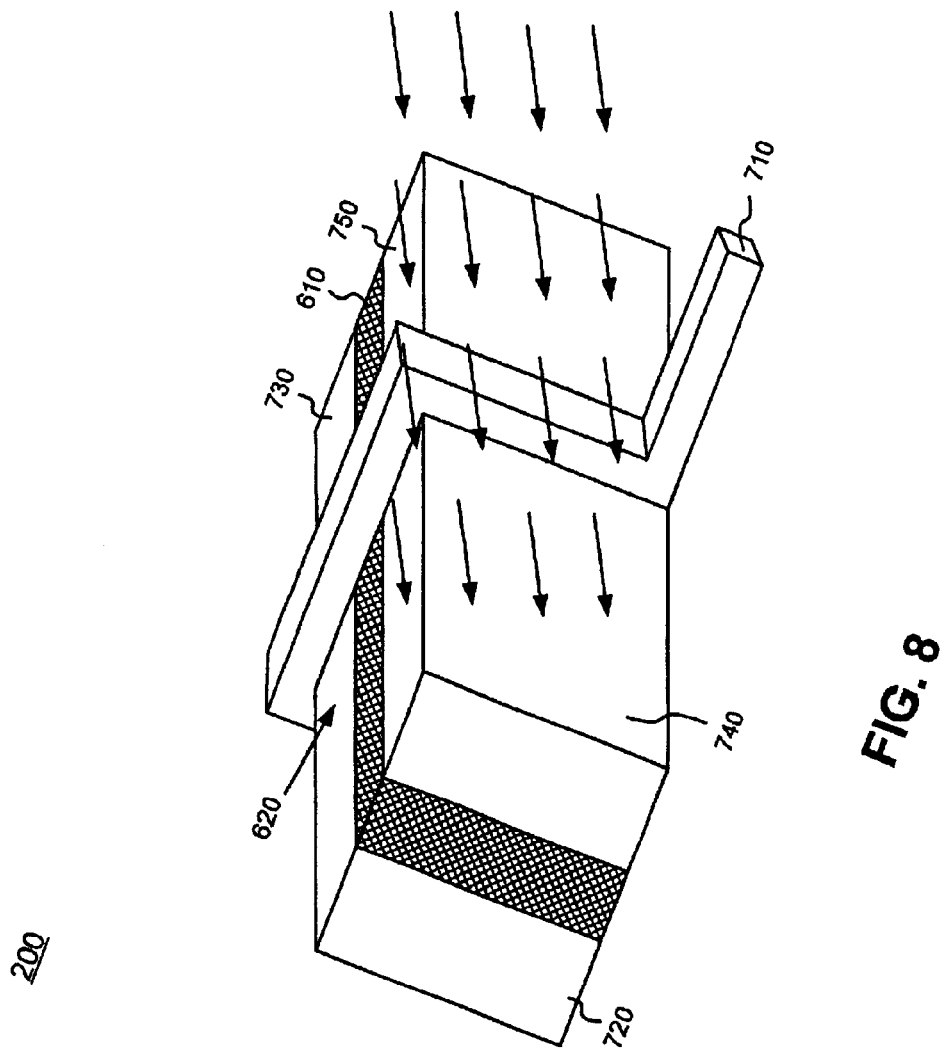

For example, a conventional implant process of n-type impurities, such as arsenic or phosphorus, may be performed to dope source region 740 and drain 750, as illustrated in FIG. 8. The n-type impurities may be implanted at a tilt angle ranging from approximately 10 degrees to 80 degrees. In an exemplary implementation, the implant process may be performed at an angle of approximately 30 degrees. Using a tilt angle ensures that source and drain regions 720 and 730 will not be doped during this first ion implantation process.

In an exemplary implementation, phosphorus may be implanted at a dosage of about $5 \times 10^{14}$ atoms/cm$^2$ to about $1 \times 10^{15}$ atoms/cm$^2$ and an implantation energy of about 3 KeV to about 6 KeV, which may depend on the thickness of source region 740 and drain region 750 and the desired junction depths for source/drain regions 740 and 750. In an alternative implementation, arsenic may be implanted at a dosage of about $5\times10^{14}$ atoms/cm$^2$ to about $1\times10^{15}$ atoms/cm$^2$ and an implantation energy of about 5 KeV to about 10 KeV, which may depend on the thickness of source region 740 and drain region 750 and the desired junction depths for source/drain regions 740 and 750.

Figure 9:
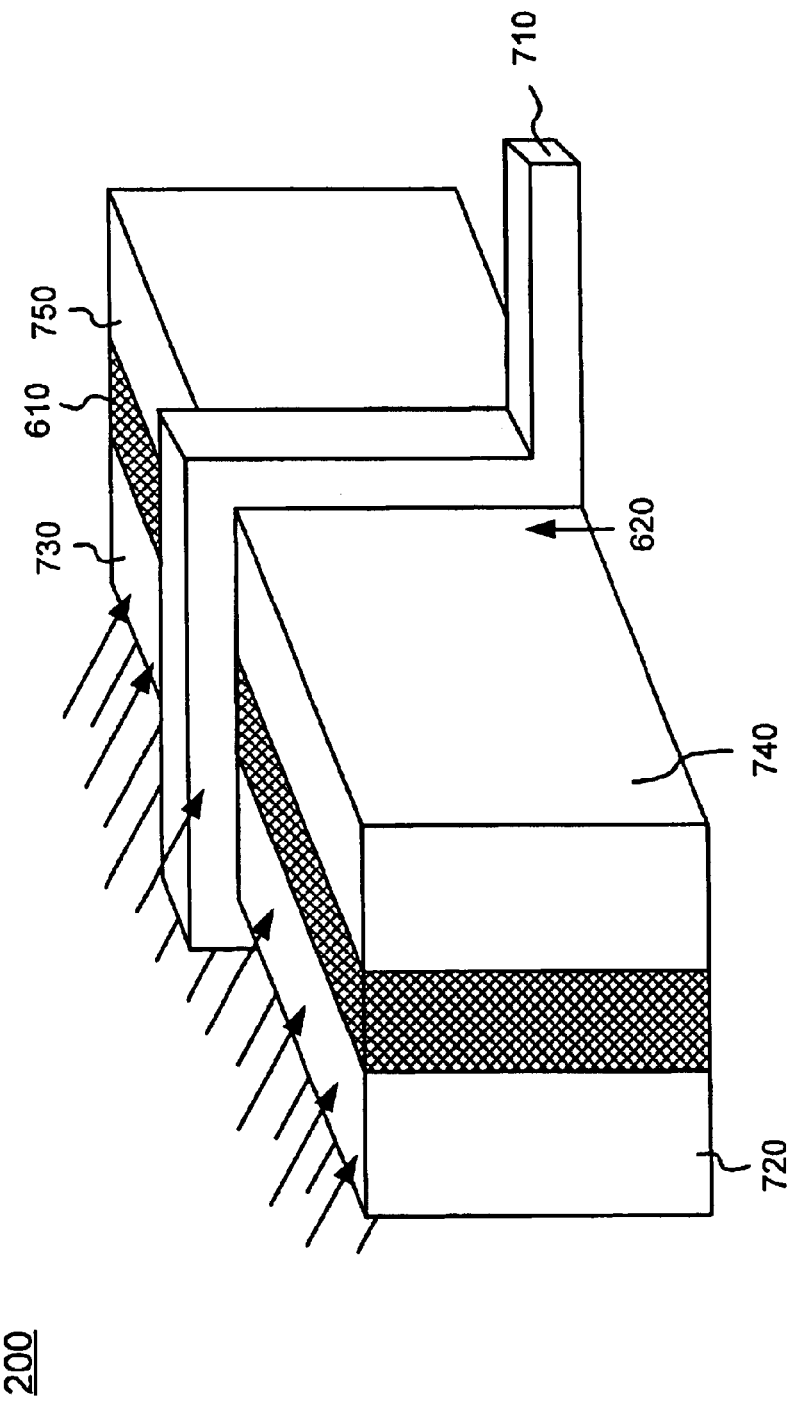

A tilt angle implant process of p-type impurities, such as boron or BF$_2$, may be performed to dope source region 720 and drain 730, as illustrated in FIG. 9. The p-type impurities may be implanted at an angle ranging from approximately 10 degrees to 80 degrees. In an exemplary implementation, the implant process may be performed at an angle of approximately 30 degrees.

The p-type impurities may be implanted at a dosage of about $5\times10^{14}$ atoms/cm$^2$ to about $1\times10^{15}$ atoms/cm$^2$ and an implantation energy of about 2 KeV to about 3 KeV, which may depend on the thickness of source region 720 and drain region 730 and the desired junction depths for source/drain regions 720 and 730. The above implant processes may alter the work function of gate 710 in the N-channel region and the P-channel region to achieve desirable threshold voltages for the resulting N-channel and P-channel devices.

It will be appreciated that sidewall spacers may optionally be formed prior to the source/drain ion implantation processes described above to control the location of the source/drain junctions based on the particular circuit requirements. Activation annealing may then be performed to activate source/drain regions 720/730 and 740/750.

Figure 10:
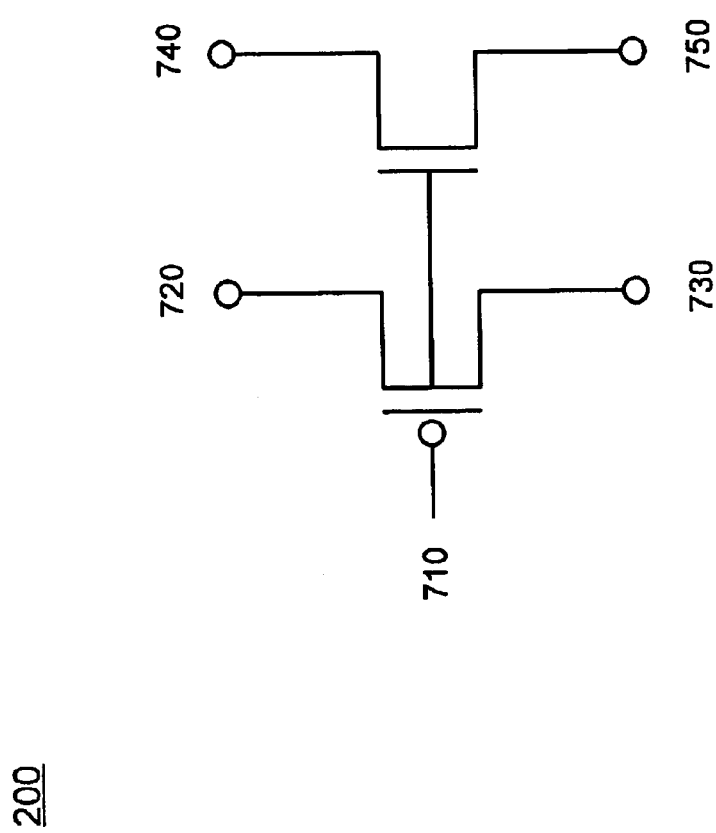

As a result of the above processing, an N-channel/P-channel transistor pair may be formed, having a common gate 710 and independent source regions 720 and 740 and drain regions 730 and 750, as illustrated in FIG. 10.

Figure 11:
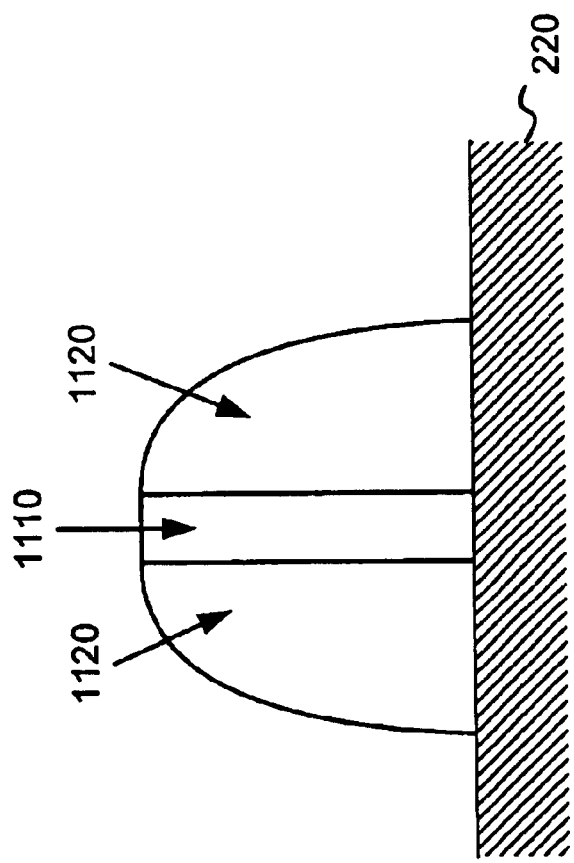
FIG. 11 illustrates an exemplary view of a fin structure in an alternative implementation consistent with the principles of the invention.

FIG. 11 illustrates an exemplary view of a fin structure in an alternative implementation consistent with the principles of the invention. As illustrated, an oxide layer may be etched in a conventional manner to form a fin structure 1110. A polysilicon layer may then be deposited and etched to form spacers 1120, adjacent the side surfaces of fin structure 1110 on buried oxide layer 220. The polysilicon material in spacers 1120 may then be re-crystallized. In this implementation, fin structure 1110 acts as the insulating material in a manner similar to insulating layer 610 (FIG. 6) to allow for separate source and drain regions to be formed for an N-channel device and a P-channel device. Processing may then continue as described above with respect to forming the gate electrode(s) and doping the source and drain regions for the N-channel and P-channel devices.

The present invention has been described above as merging N-channel and P-channel FinFET devices on a single fin structure. As a result, a maximum density for complimentary FinFET structures can be achieved.

Other Implementations

Figure 12:
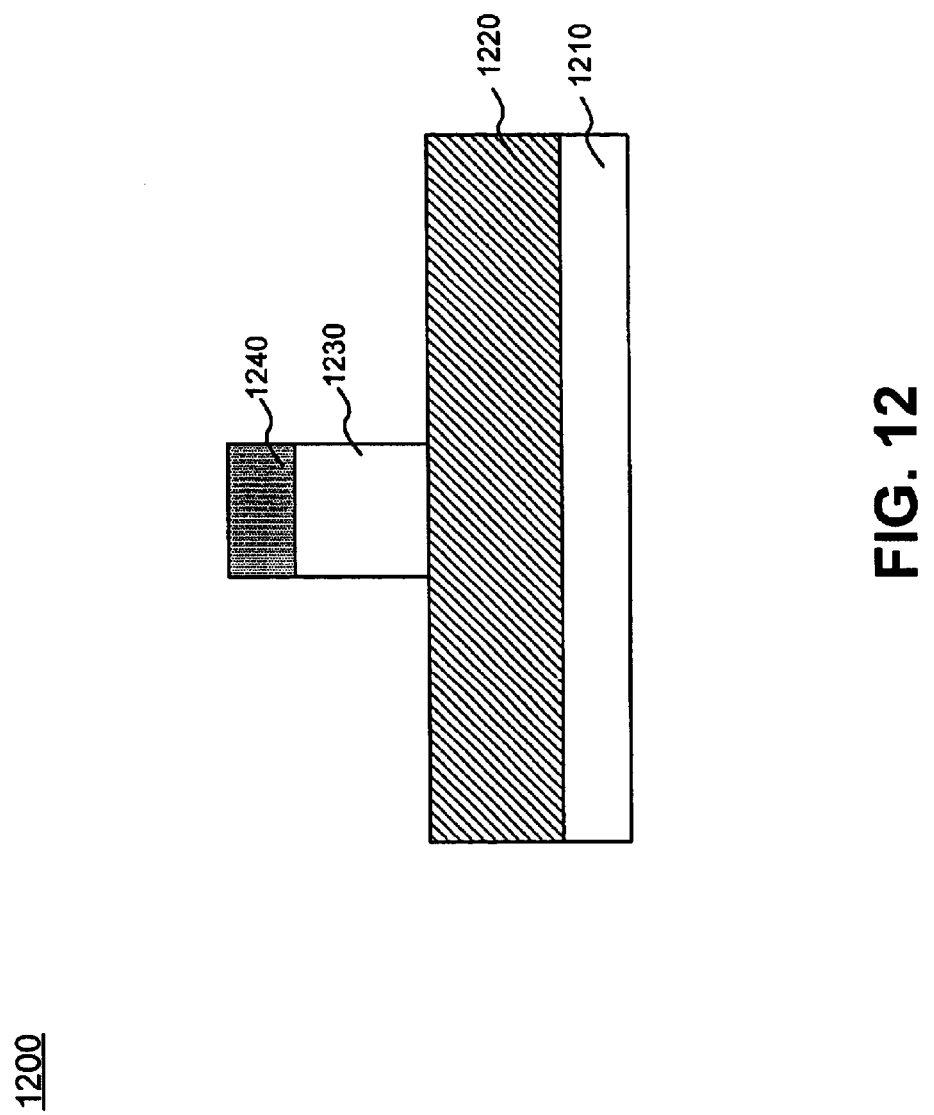
FIGS. 12–15 illustrate exemplary views for merging N-channel and P-channel FinFET devices on a single fin structure in an alternative implementation consistent with the principles of the invention.

FIGS. 12–15 illustrate exemplary views for merging N-channel and P-channel FinFET devices on a single fin structures in an alternative implementation consistent with the principles of the invention. With reference to FIG. 12, processing may begin with a semiconductor device 1200 that includes a SOI structure having a silicon substrate 1210, a buried oxide layer 1220, and a silicon layer on buried oxide layer 1220. Buried oxide layer 1220 and the silicon layer may be formed on substrate 1210 in a conventional manner.

In an exemplary implementation, buried oxide layer 1220 may include a silicon oxide and may have a thickness ranging from about 1500 Å to about 3000 Å. The silicon layer may include monocrystalline or polycrystalline silicon having a thickness ranging from about 200 Å to about 1000 Å. The silicon layer 1230 is used to form a fin structure, as described in more detail below.

In alternative implementations consistent with the present invention, substrate 1210 and the silicon layer may comprise other semiconducting materials, such as germanium, or combinations of semiconducting materials, such as silicon-germanium. Buried oxide layer 1220 may also include other dielectric materials.

A photoresist material may be deposited and patterned to form a photoresist mask 1240 for subsequent processing. The photoresist material may be deposited and patterned in any conventional manner.

Semiconductor device 1200 may then be etched to form a fin structure 1230, as illustrated in FIG. 12. In an exemplary implementation, silicon layer 1230 may be etched in a conventional manner, with the etching terminating on buried oxide layer 1220. The portion of silicon layer 1230 located under photoresist mask 1240 has not been etched, thereby forming a fin structure 1230 comprising silicon.

Figure 13:
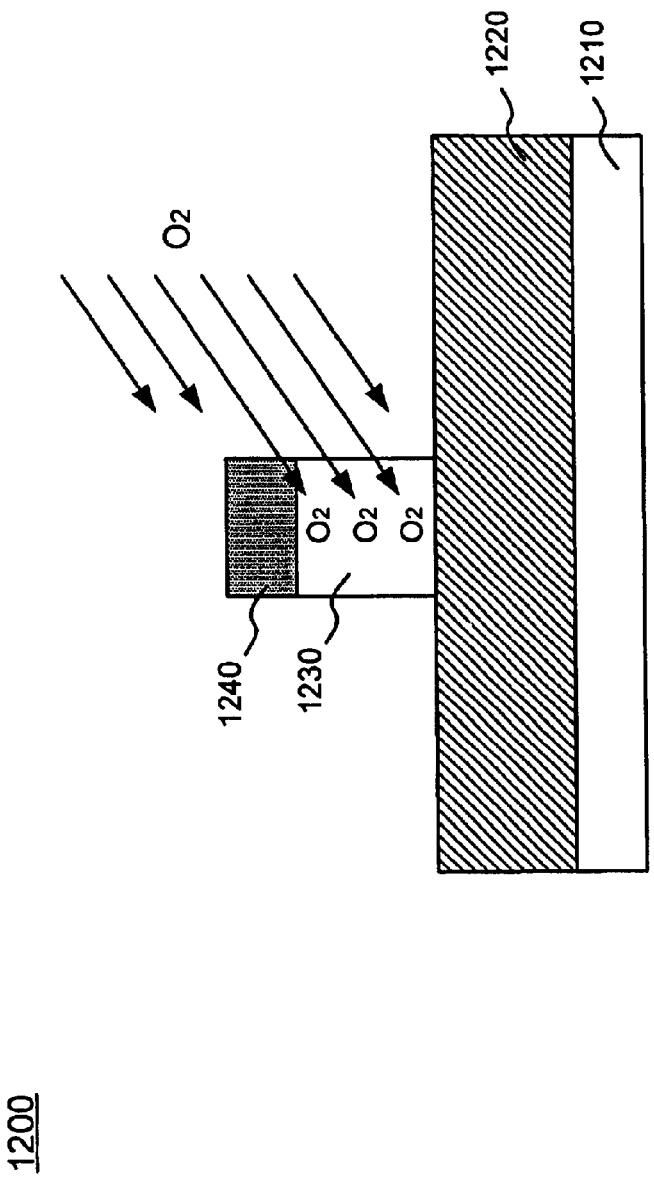
Figure 14:
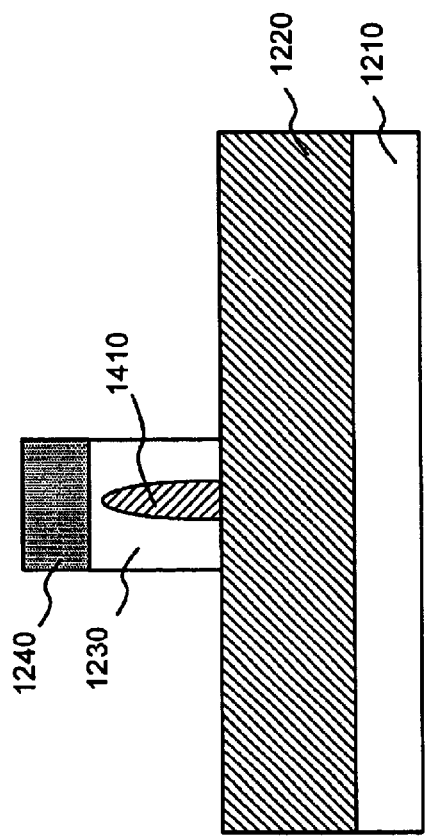
Figure 15:
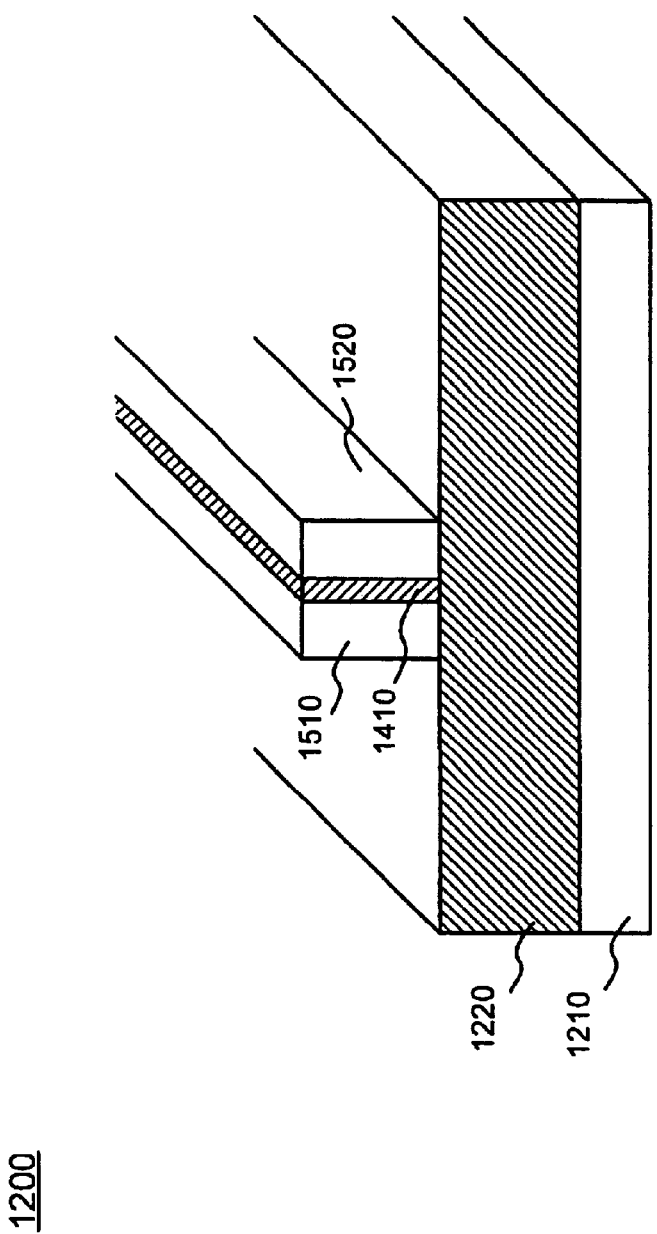

O$_2$ may then implanted into fin structure 1230 at an angle to a controlled depth, as illustrated in FIG. 13. Heat may then be applied to semiconductor device 1200 to convert the O$_2$ in fin structure 1230 into silicon dioxide (SiO$_2$) 1410, as illustrated in FIG. 14. Photoresist mask 1240 may be removed and fin structure 1230 may be polished or etched back to create isolated silicon fin pairs 1510 and 1520, as illustrated in FIG. 15.

Figure 16:
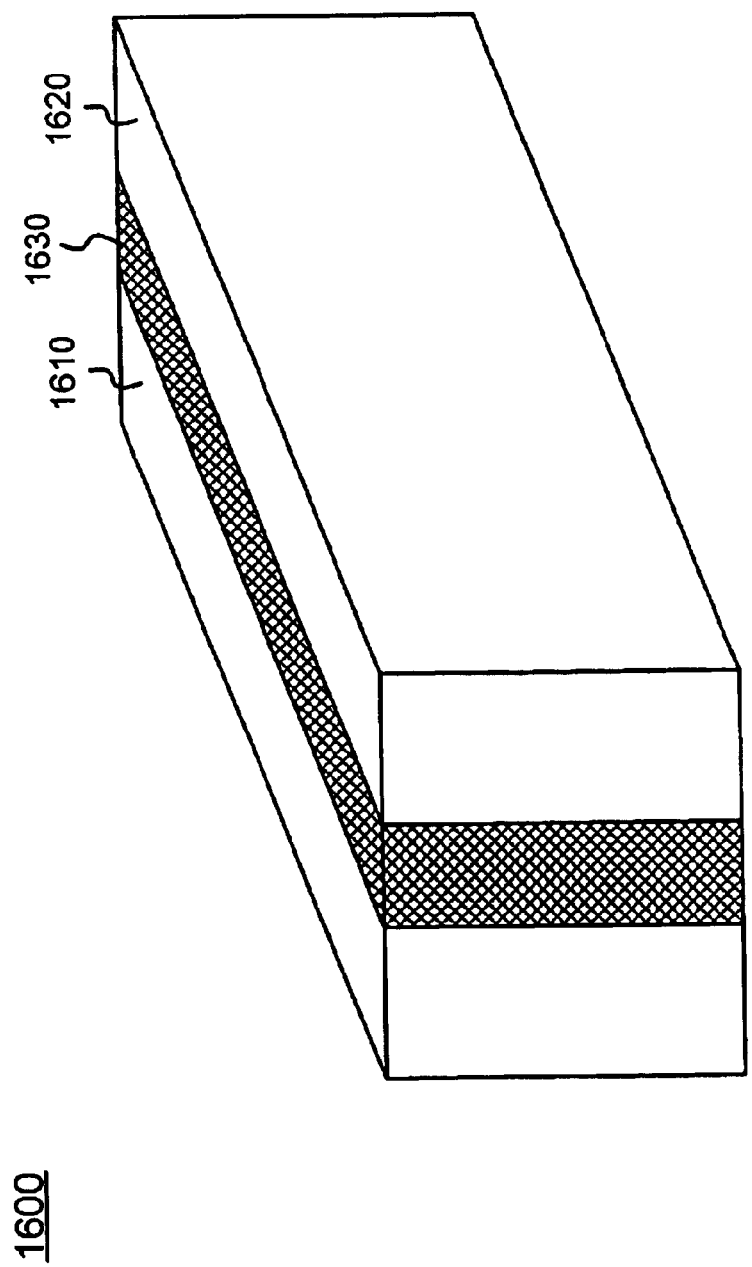
FIGS. 16–20 illustrate exemplary views for creating a static random access memory (SRAM) device according to an alternative implementation consistent with the principles of the invention.

In another implementation, the above-described merged FET designs may be used for forming a static random access memory (SRAM). As illustrated in FIG. 16, a merged N-channel/P-channel semiconductor device 1600 may be formed, to include an N-channel device 1610 separated from a P-channel device 1620 by an insulating layer 1630. In one implementation, insulator 1630 may comprise an oxide. N-channel device 1610 and P-channel device 1620 may be formed by depositing, etching, and re-crystallizing polysilicon spacers in a manner similar to that described above with respect to FIG. 11.

Figure 17:
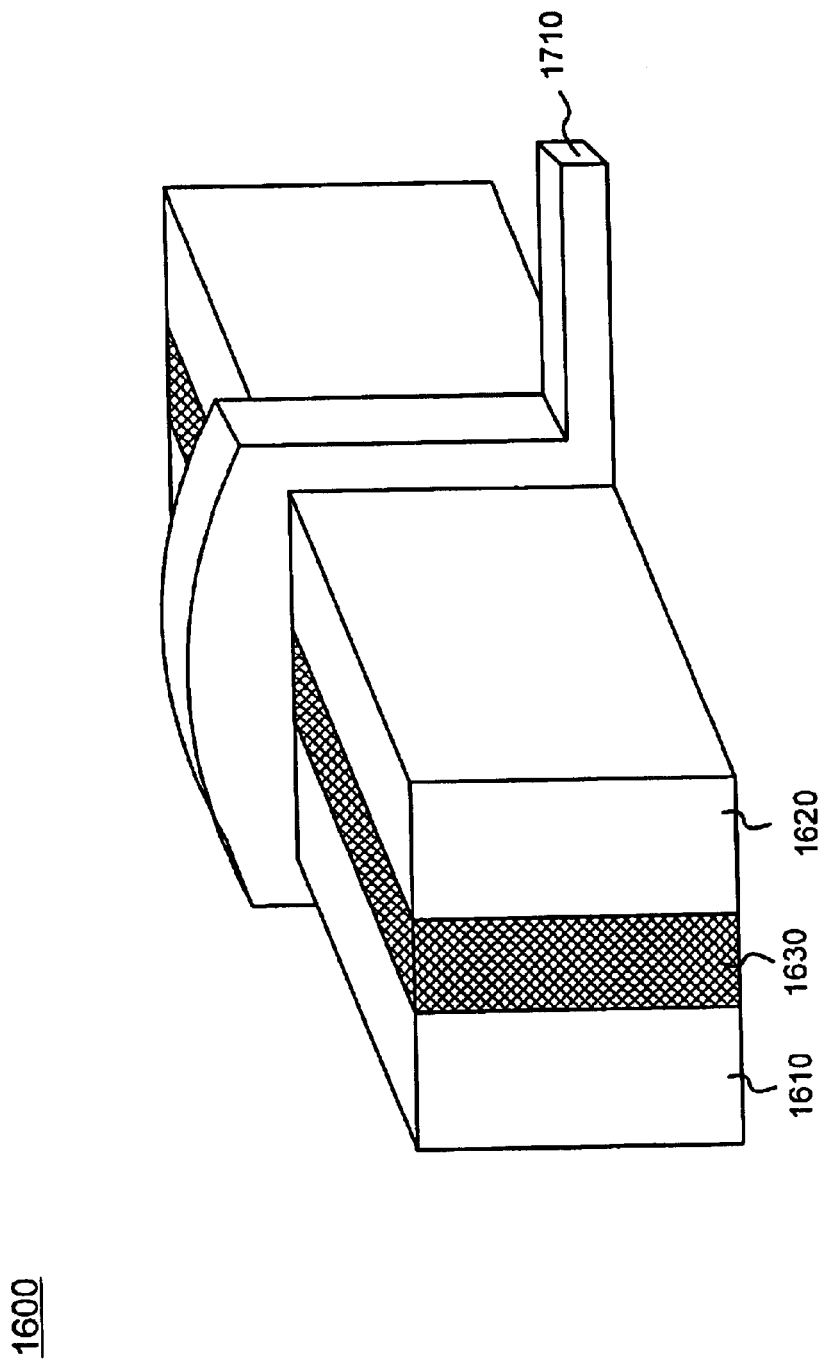
Figure 18:
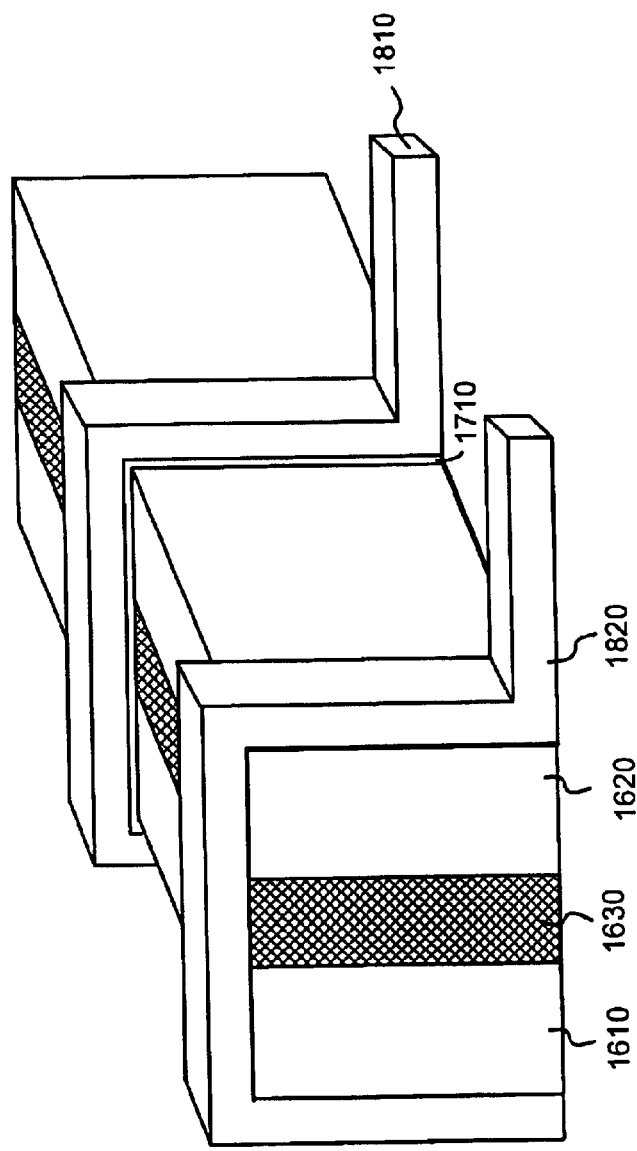

A selective oxide strip 1710 may then be grown on semiconductor device 1600, as illustrated in FIG. 17. Oxide strip 1710 may be etched and gates 1810 and 1820 may be formed by depositing and patterning polysilicon over semiconductor device 1600, as illustrated in FIG. 18. The source and drain regions of N-channel device 1610 and P-channel device 1620 may then be doped with n-type or p-type impurities based on the particular end device requirements. In exemplary implementations consistent with the principles of the invention, the source and drain regions of P-channel device 1620 may be doped with p-type impurities and the source and drain regions of N-channel device 1610 may be doped with n-type impurities.

Figure 19:
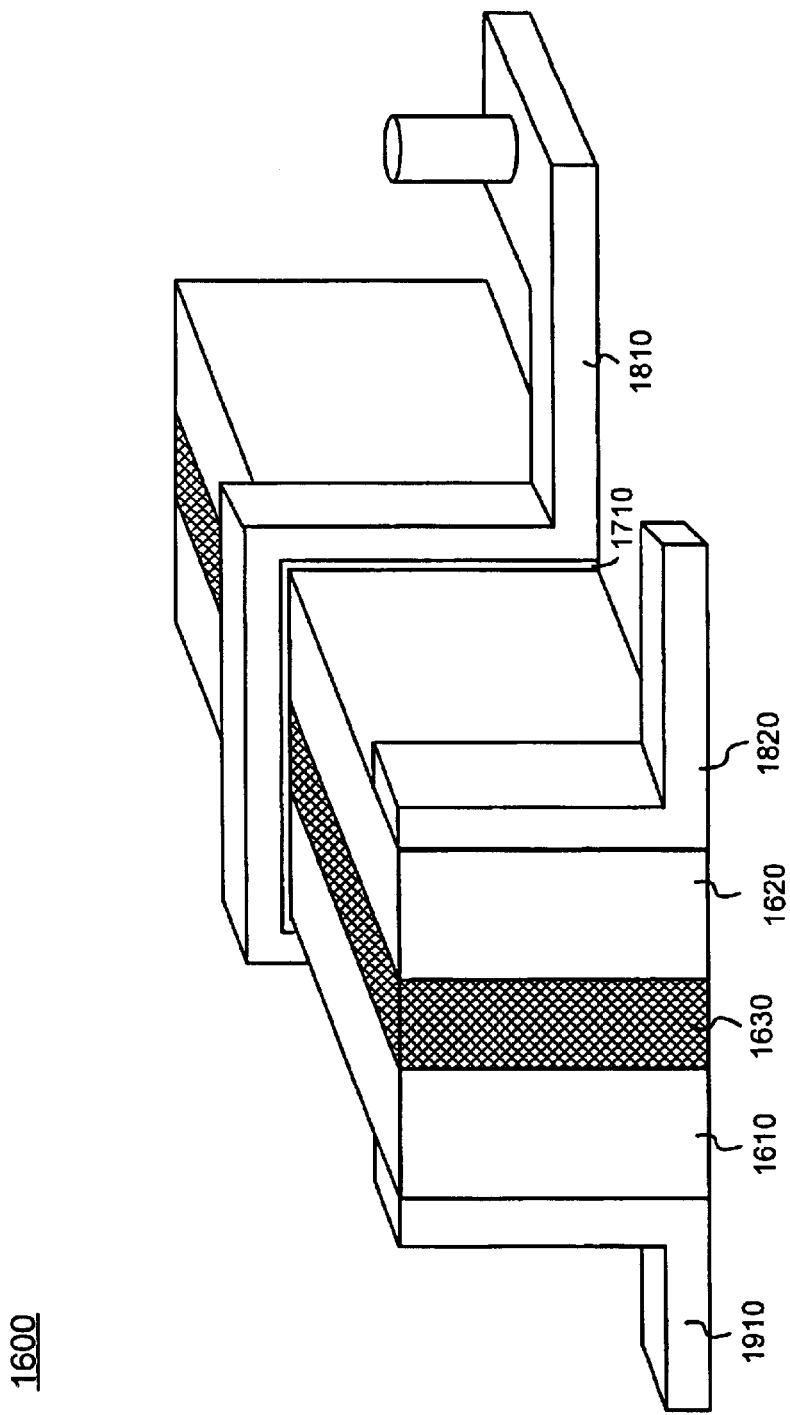

Polysilicon may then be deposited and patterned for forming the contacts and interconnect, as illustrated in FIG. 19. The polysilicon may also be selectively removed in the source region of semiconductor device 1600. Once removed, a polysilicon contact 1820/1910 is formed on both sides of semiconductor device 1600 in the source region.

Figure 20:
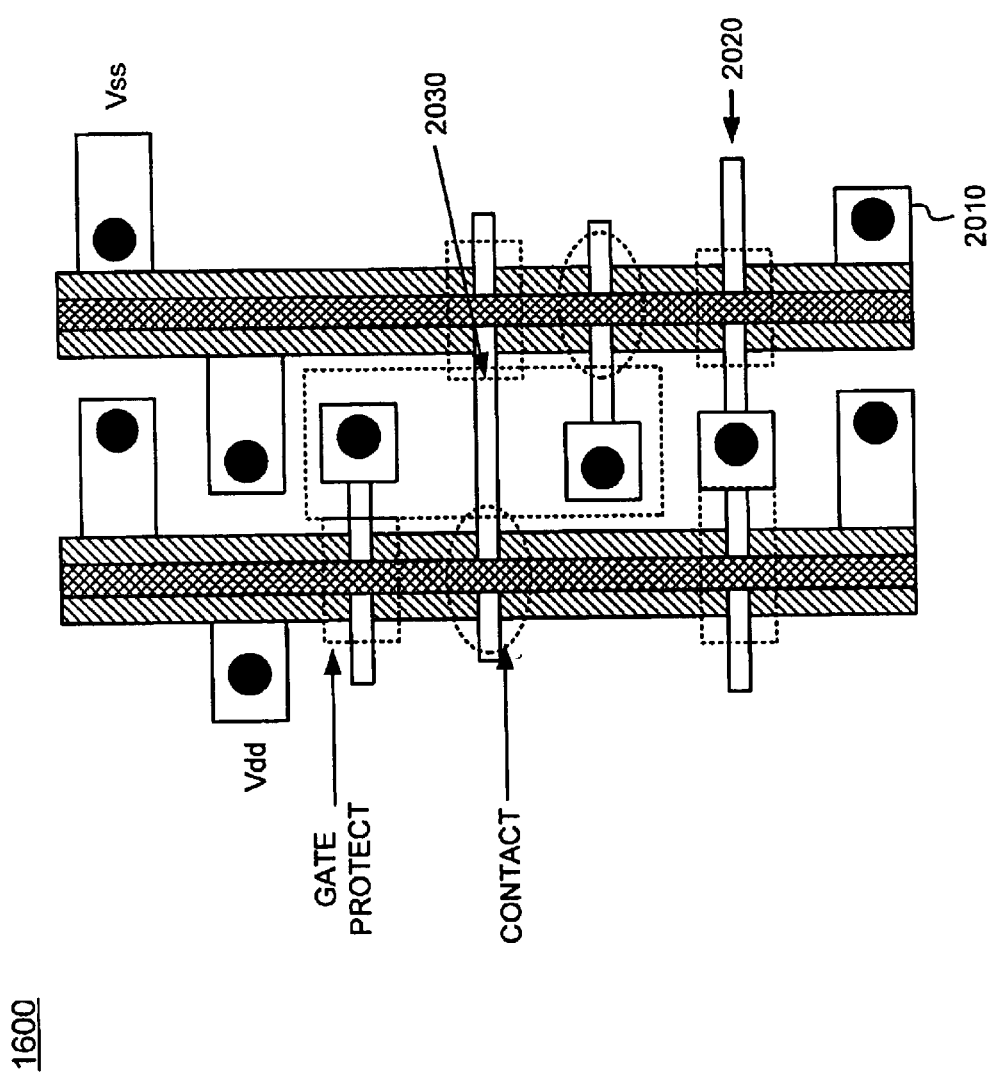

Conventional processing may then be performed to complete the SRAM device. FIG. 20 illustrates a merged FinFET SRAM bit that may be formed from the above-processing. As illustrated, SRAM device 1600 includes a group of separate bitline contacts 2010, a wordline 2020, and an M1 jumper 2030.

CONCLUSION

Implementations consistent with the principles of the invention merge N-channel and P-channel FinFET devices on a single fin structure. As a result, increased density for complimentary FinFET structures can be achieved.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While a series of acts has been described with regard to FIG. 1, the order of the acts may be varied in other implementations consistent with the present invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used.

The scope of the invention is defined by the claims and their equivalents.

What is claimed is:

1. A semiconductor device, comprising:
   a fin structure comprising a semiconducting material, the fin structure including an insulating layer;
   a source region formed at one end of the fin structure and including the insulating layer, the insulating layer separating the source region into a first source region and second source region;
   a drain region formed at an opposite end of the fin structure and including the insulating layer, the insulating layer separating the drain region into a first drain region and second drain region; and
   at least one gate.

2. The semiconductor device of claim 1 wherein a width of the insulating layer ranges from about 20 Å to about 30 Å.

3. The semiconductor device of claim 1 wherein the first source region and the first drain region are formed on a first side of the insulating layer and the second source region and the second drain region are formed on an opposite side of the insulating layer.

4. The semiconductor device of claim 3 wherein the first source region and the first drain region are part of an N-channel device, and
   wherein the second source region and the second drain region are part of a P-channel device.

5. The semiconductor device of claim 1 wherein each of the N-channel device and the P-channel device includes the at least one gate.

6. The semiconductor device of claim 1 wherein the insulating layer comprises an oxide.

7. The semiconductor device of claim 1 wherein the insulating layer comprises a high K dielectric.

8. A semiconductor device, comprising:
   a fin structure that includes an insulating layer that extends a length of the fin structure and positioned approximately in a center of the fin structure;
   a source region formed at one end of the fin structure and including the insulating layer, the insulating layer separating the source region into a first source region and second source region; and
   a drain region formed at an opposite end of the fin structure and including the insulating layer, the insulating layer separating the drain region into a first drain region and second drain region.

9. The semiconductor device of claim 8 further comprising at least one gate formed over the fin structure.

10. The semiconductor device of claim 8 wherein a width of the fin structure ranges from about 20 Å to about 30 Å.

11. The semiconductor device of claim 10 wherein a width of the insulating layer ranges from about 20 Å to about 30 Å.

12. The semiconductor device of claim 8 wherein the first source region and the first drain region are formed on a first side of the insulating layer and the second source region and the second drain region are formed on an opposite side of the insulating layer.

13. The semiconductor device of claim 12 wherein the first source region and the first drain region are part of an N-channel device, and
    wherein the second source region and the second drain region are part of a P-channel device.

14. The semiconductor device of claim 8 wherein the first source and drain regions are doped with n-type impurities and the second source and drain regions are doped with p-type impurities, and
    wherein the semiconductor device further comprising:
    a common gate formed on at least a top and one side surface of the fin structure.

15. The semiconductor device of claim 8 wherein the insulating layer comprises a high K material.

16. A semiconductor device comprising:
    an N-channel device including a first source region, a first drain region, a first fin structure, and a gate; and
    a P-channel device including a second source region, a second drain region, a second fin structure, and the gate, the second source region, the second drain region, and the second fin structure being separated from the first source region, the first drain region, and the first fin structure by an insulating layer.

17. The semiconductor device of claim 16 wherein a width of the insulating layer ranges from about 20 Å to about 30 Å.

18. The semiconductor device of claim 16 wherein the insulating layer comprises an oxide.

19. The semiconductor device of claim 16 wherein the insulating layer comprises a high K material.

20. The semiconductor device of claim 16 wherein a width of each of the first fin structure and the second fin structure ranges from about 20 Å to about 30 Å.

* * * * *